United States Patent [19]

Willmore

[11] 4,034,156

[45] July 5, 1977

[54] APPARATUS FOR THE IDENTIFICATION OF FEEDBACK TAPES IN A SHIFT REGISTER GENERATOR

[75] Inventor: Robert R. Willmore, Millersville, Md.

[73] Assignee: The United States of America as represented by the Secretary of the Air Force, Washington, D.C.

[22] Filed: July 9, 1973

[21] Appl. No.: 377,170

Related U.S. Application Data

[63] Continuation-in-part of Ser. No. 77,355, Oct. 1, 1970, abandoned.

[52] U.S. Cl. .................................. 178/22; 235/181; 328/37; 235/92 SH; 340/146.1 AV; 343/18 E

[51] Int. Cl.² .................... G11C 19/00; H04K 3/00

[58] Field of Search ............... 328/37, 119; 178/22; 235/181, 92 SH; 307/221 R; 340/146.1 D, 146.1 AV

[56] References Cited

UNITED STATES PATENTS

| | | | |
|---|---|---|---|
| 3,217,297 | 11/1965 | Delugeau | 328/37 |
| 3,439,279 | 4/1969 | Guanella | 328/37 |
| 3,598,979 | 8/1971 | Moreau | 328/37 |
| 3,599,209 | 10/1969 | Goodrich | 235/181 |
| 3,670,151 | 6/1972 | Lindsay et al. | 328/37 |

*Primary Examiner*—Howard A. Birmiel
*Attorney, Agent, or Firm*—Joseph E. Rusz; Julian L. Siegel

[57] ABSTRACT

A shift register generator feedback tap identification system in which a received code is fed to a register which detects when the code contains all 1's at which time a bit position counter and a variable tap shift register generator are reset and a null-filter is enabled. The bit position counter controls the tap positions of the variable tap shift register generator and the output thereof is fed to the null-filter which compares the received code with the code from the variable tap shift register generator.

4 Claims, 9 Drawing Figures

APPARATUS FOR THE IDENTIFICATION OF FEEDBACK TAPES IN A SHIFT REGISTER GENERATOR

CROSS-REFERENCE TO RELATED INVENTION

This application is a continuation-in-part of my co-pending patent application, Ser. No. 77,355, filed on Oct. 1, 1970, now abandoned.

BACKGROUND OF THE INVENTION

This invention relates to systems for identifying random codes, and more particularly to a system for determining the feedback tap position of a shift register generator pseudorandom code modulator.

The advent of the shift register generator, with its capability of generating a noise-like pseudo-random sequence with a unique correlation property, has resulted in a new family of ultra-secure communication systems. These systems rely on the noise-like properties of pseudo-random code modulation to prevent hostile receiver interception and use cross-correlation techniques to give their receivers a high jamming resistance. The pseudo-random code is generally obtained from a linear shift register that is driven by a clock frequency oscillator. In the secure transmitter, information is usually impressed on the pseudo-random code which is used to modulate a stable local oscillator frequency source with the resulting signal being transmitted. In a secure receiver, the received signal is demodulated to video using a stable local oscillator frequency source identical to that contained in the transmitter. The video is cross-correlated with an internally generated pseudo-random code also identical to that generated in the transmitter. The output from the cross-correlator contains the information content being transmitted.

If a hostile receiver is to intercept the secure communication system's message or prepare a suitable jamming copy, it must determine the oscillator frequency, dock frequency, length of the shift register generator and the shift register generator taps. Several methods, using phase lock loop principles, have been used in the past to determine the oscillator frequency such as a method which can be used in phase locking a reference oscillator to the clock frequency. The length of the shift register generator or the number of stages can also be found. Hence to completely solve the intercept and jamming problems, it becomes necessary to determine the feedback taps employed in the shift register generator.

Several study programs have been directed toward the problem of determination of feedback tap locations through analysis of the received pseudo-random code. One program resulted in a technique with the capability of determining tap position with the aid of a computer. However, the size and complexity of the computer would make it impractical for most applications. Another program developed a system called LISA. The technique employed by LISA (linear sequence analyzer) is to switch in all possible feedback tap combinations, in an internal shift register generator, until the code generated is identical to that being received. However, for a 20-stage shift register generator there are twenty-four thousand possible tap combinations that generate maximum sequences. LISA reduces the number of possible combinations by operating only against those codes produced by a four-feedback tap shift register generator.

SUMMARY OF THE INVENTION

The tap recognition system described in this disclosure provides a method of determining the quantity and locations of the feedback taps used to generate a received pseudo-random code. In the tap recognition unit, a portion of the code sequence $(n + 1)$ bits, following $n$ 1's is analyzed using a variable tap shift register generator to generate a code using all known tap locations and a null-filter to compare the generated code with the received code to determine the next feedback tap location, if any.

It is therefore an object of this invention to provide an improved system for determining feedback tap positions of shift register generator pseudo-random code modulators.

It is another object to provide a tap recognition system that eliminates the size and complexity of computer techniques but still is able to determine unlimited tap positions.

These and other advantages, features and objects of the invention will become more apparent from the following description taken in connection with the illustrative embodiment in the accompanying drawings, with like reference characters denoting like components, wherein:

Figure 4:
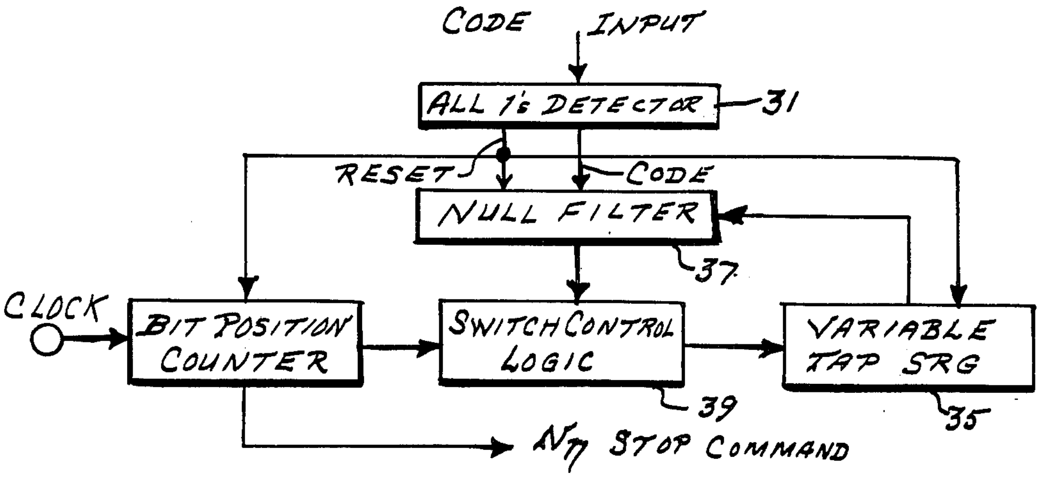
Figure 3A:
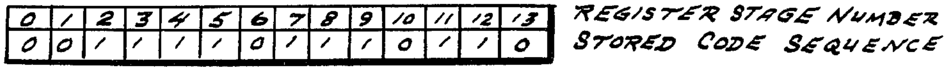
Figure 3B:
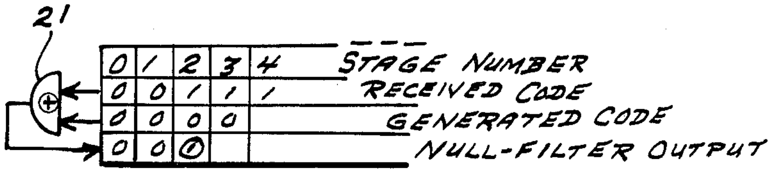
Figure 3C:
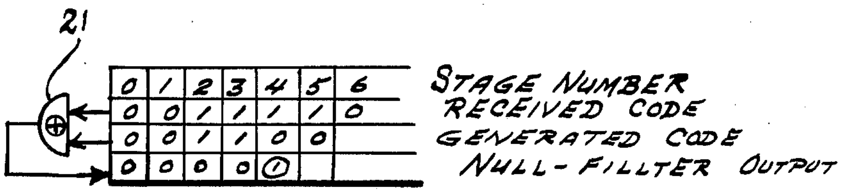
Figure 3D:
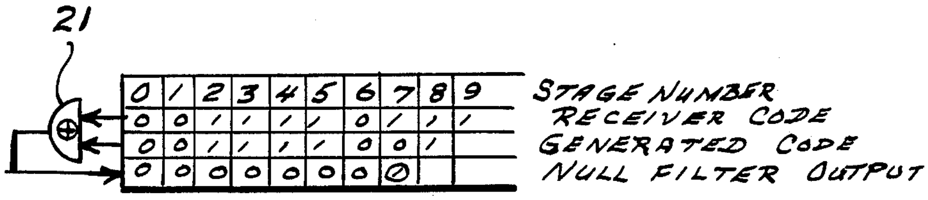
Figure 3E:
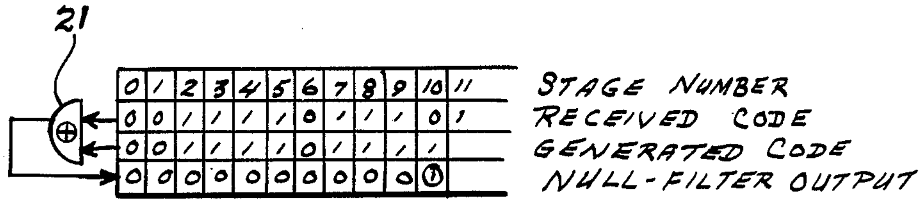

FIGS. $3a$ – $3e$ are code representations used in explanation of the invention;

FIG. 4 is a block diagram showing an embodiment of the invention; and

Figure 5:
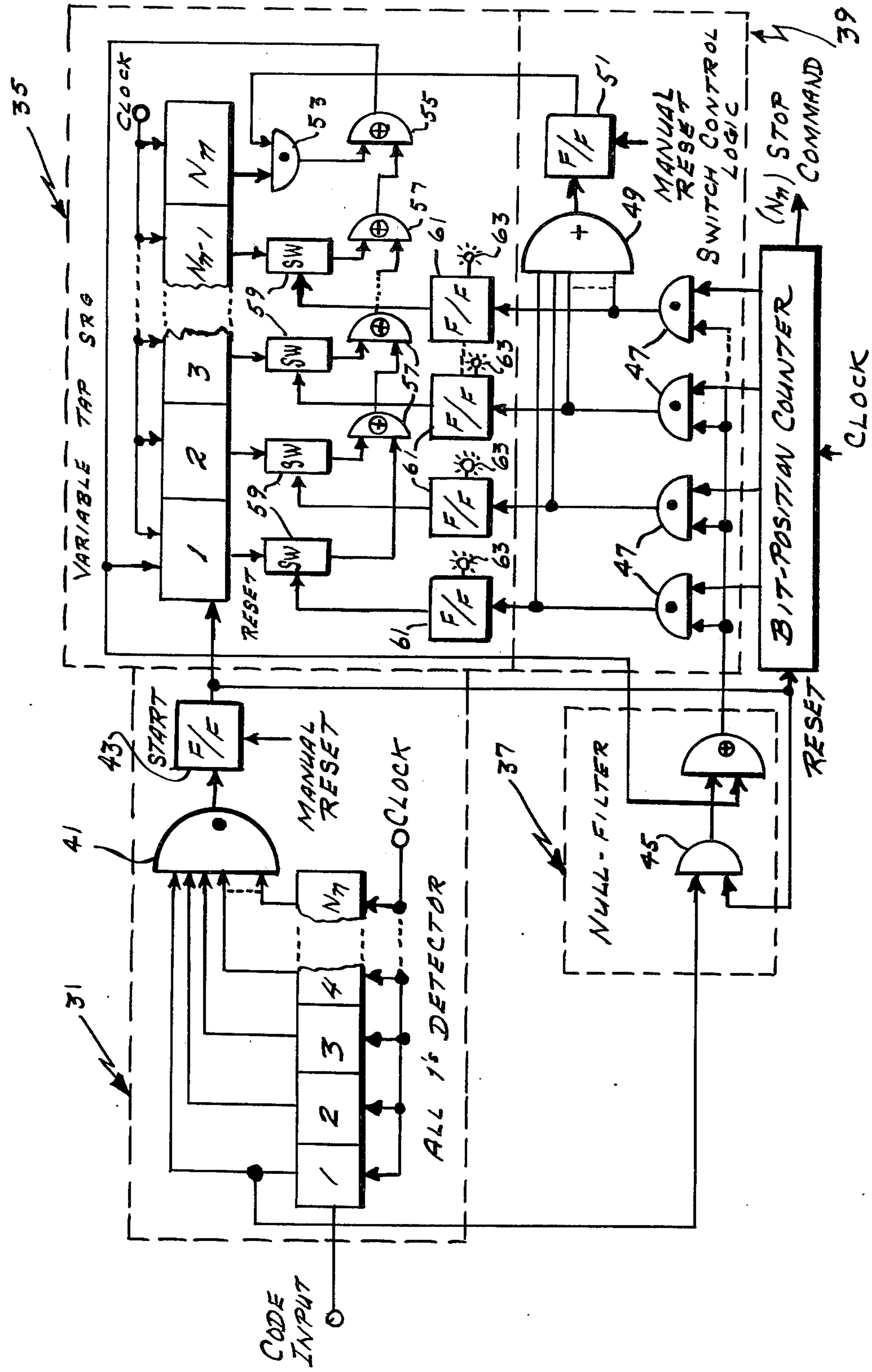

FIG. 5 is a schematic diagram showing details of that shown in FIG. 4.

DETAILED DESCRIPTION OF THE PREFERRED EMBODIMENT

The tap recognition unit being disclosed performs a simple analysis on $(n + 1)$ bits (where $n$ equals the number of stages contained in the shift register generator) of the code sequence following $n$ 1's to determine the feedback tap locations. This invention requires prior knowledge of the clock frequency and register length. However, the tap recognition system will operate regardless of the number of feedback taps being employed to generate the received code. A brief discussion of shift register generators is required before the principles employed by the tap recognition system can be better understood.

Figure 1:
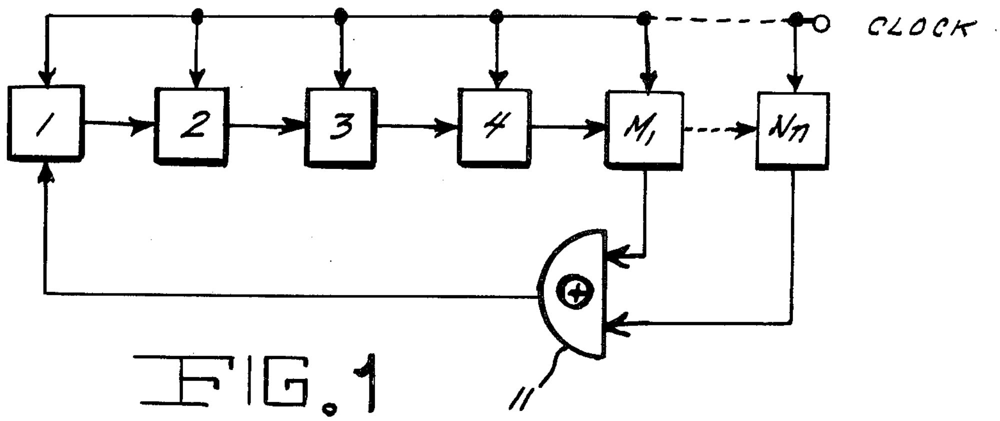
FIG. 1 is a schematic diagram showing a shift register generator with two feedback taps.
Figure 2:
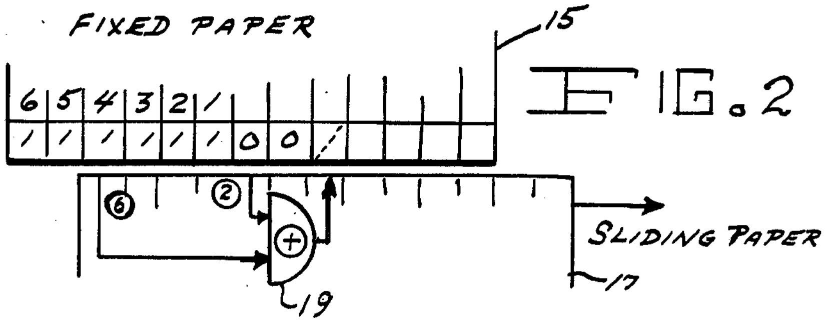
FIG. 2 shows an equivalent system used to determine the code of a shift register generator using two feedback taps.

A typical two-feedback tap shift register generator as shown in FIG. 1 consists of $n$ clock driven states, with feedback taps at $N_n$ and $M_1$ where $N_n$ denotes the $n$'th or last shift register generator flip-flop stage and $M_1$ denotes the flip-flop stage number associated with the first feedback tap. It is to be understood that $N_n$ is always a feedback tap and that there will always be an odd number, of additional feedback taps $(1, 3, \ldots k)$ with the lowest stage number serving as a feedback tap referred to as $M_1$, the second lowest stage number serving as a feedback tap referred to as $M_2$, and the $k^{th}$ lowest stage number serving as a feedback tap referred to as $M_k$. The outputs from the two taps are fed back to the first stage through exclusive OR circuit 11. The code generated in the shift register generator is not truly random but has identifying characteristics which could be used for analysis. For example, the code period of a linear shift register generator producing a maximal sequence is given by $2^n - 1$ bits. Within this period, the longest run contained is $n$ 1's. The particular code sequence that is being generated by the shift register generator can be written, as shown in FIG. 2, with two pieces of paper 15 and 17. Exclusive OR 19 is drawn corresponding to tap position, on a sliding piece of paper 17. The paper 17 is then moved, with respect to the fixed paper 15, one bit position at a time and the results of the exclusive OR process is placed at the new input. The same procedure can be used to determine the code sequence of a multiple feedback tap arrangement.

The code sequence generated (after the initial shift register generator stage of all 1's) by an $n$ stage shift register generator with a single inverted feedback tap at $N_n$ is composed of $n$ 0's, $n$ 1's, $n$ 0's, etc. The code generated by a shift register with an additional feedback tap at $M_1$ differs from the single tap code only after the input from the tap at $M_1$ has changed polarity or, as shown in FIG. 2, when the first feedback tap slides past the first shift register generator stage and thus changes state. Hence, for a two feedback tap shift register generator, the code following the initial state of all 1's, consists of $M_1$ 0's and than a 1. After $M_1$ has been located, a shift register generator can be constructed and its output compared to the received code through an exclusive OR process. This type of unit, shown in FIG. 3, will be referred to as a null-filter and will produce all 0's when the codes are identical and synchronized. If an additional 1 is produced by the null filter it will occur when a second feedback tap $M_2$ changes state or slides past the first shift register generator stage.

As previously stated, the output from the null-filter will be all 0's if the received code is identical to the code being generated by the internal two tap shift register generator. Should the output from the null-filter not be all 0's then there must be additional taps causing further changes in the received code. The next 1 generated by the null-filter will occur when the second feedback tap input $M_2$ changes state or slides past the first shift register generator stage.

In a multiple feedback shift register generator, the first feedback taps, $M_1$ and $M_2$, comprise the first exclusive OR inputs and will be the first taps influencing the code sequence following $n$ 1's. At the $n$ 1's state all exclusive OR inputs are 1's. The following bit will always be a 0 because all exclusive OR inputs are 1's. The code will continue to be all 0's until, as previously described, the input from the tap at $M_1$ has changed polarity or, as shown in FIG. 2, has slid past the first shift register stage. The code following $n$ 1's will continue to be that of a shift register generator with $M_1$ stages until $M_2$ changes state or slides past the first generator stage. The code generated will then be that generated by a shift register generator with feedback taps at $M_1$ and $M_2$. All other exclusive OR inputs, including $N_n$, will be 1's until another feedback tap, $M_3$, changes state or slides past the first shift register generator stage. The first 1 will indicate the location and presence of $M_3$.

A new code sequence is generated using the known feedback taps $M_1$, $M_2$, $M_3$ and $N_n$. If the received code was generated by a four-tap shift register generator, the output from the null-filter will be all 0's. If the null-filter is not all 0's, then the same logical processes used to find the previous taps can be used to locate the quantity and location of the remaining taps.

An example using a 13-stage shift register generator with six feedback taps, 2, 4, 7, 8, 10 and 13, is used to help further illustrate the system and is shown in FIGS. *3a* and *3e*. Assume a small portion of the sequence ($n$ + 1) bits, following the initial condition of $n$ 1's has been stored in a register and found to be as shown in FIG. *3a*. A comparison in the null-filter using the inverted output from a single shift register feedback tap $N_n$ at 13 shows that the first feedback tap $M_1$ is located at 2 as determined by exclusive OR circuit which is shown in FIG. *3b*. A new comparison is then made with shift register taps at 2 and 13. The second feedback tap $M_2$ is found to be located at 4, as shown in FIG. *3c*. Another comparison is now made with taps at 2 and 4. The third feedback tap $M_3$ is found to be located at 7, as shown in FIG. *3d*. A comparison is now made using taps at 2, 4, 7, and 13 and similarly a tap, $M_4$, is found at 8. A comparison now is made using taps at 2, 4, 7, and 8. The fifth and final taps $M_5$ is found to be located at 10, as shown in FIG. *3e*. A final comparison using taps at 2, 4, 7, 8, 10 and 13 is required to check for additional feedback taps. The results of this check would be all 0's from the null-filter.

As shown in FIG. 4, the code input is fed to detector 31 which determines when the code sequence contains all 1's. Upon such an occurrence, a reset pulse is fed to bit position counter 33 and variable tap shift register generator 35. The received code and the code from shift generator 35 are compared in null-filter 37. If the codes are different, shift register generator 35 will be altered by switch control logic circuit 39 which receives pulses from counter 33 and null-filter 37.

In the tap recognition system, shown in FIG. 5, the received code sequence is clocked through the $n$ stage shift register contained in all 1's detector 31. When an all 1 condition exists in the register, AND gate 41 output becomes a 1. The next bit arriving to the register is an 0 inhibiting AND gate 41, forming a pulse one bit wide. The trailing edge of the pulse is used to trigger start flip-flop 43 which resets the shift register generator to all 1's, the bit-position counter to all 0's, and enables input AND gate 45 in null-filter 37.

The code following the all 1's condition is compared in null-filter 37 to the code generated by feeding back to the input the inverted output from a single tap at $N_n$. The output from null-filter 37 is fed to a series of AND gates 47 contained in switch control logic 39. AND gates 47 are enabled and inhibited in sequence by bit-position counter 33 which counts the number of clock pulses or bits that have occurred since the all 1's condition. The first AND gate is enabled on the count of one and inhibited on the count of two. The second AND gate is enabled on the count of two and inhibited on the count of three, etc. Hence, the first 1 arriving from null-filter 37 is directed by switch control logic 39 to the proper feedback tap switch and closes it. The 1 from null-filter 37 also passes via AND gate 47 through OR gate 49 and sets flip-flop 51 to 1 which inhibits AND gate 53 and connects the output from tap $N_n$ to exclusive OR gate 55. The next pulse arriving from null-filter 37 resets flip-flop 51 to 0, enables AND gate 53, thus removing tap $N_n$ from the feedback network. Flip-flops 61 are activated only once. Manual reset is required to repeat the operation. The bit position counter enables in succession each of the AND gates 47 for a one clock bit duration. If during this time a 1 is present from the null filter, it is passed through the AND gates 47 and activates the flip-flop 61 associated with the bit position.

Exclusive OR gates 57 are placed between tap switches 59 in the variable tap shift register generator. If a tap switch 59 feeding an exclusive OR gate 57 circuit is open, the exclusive OR passes the other input. That is $A + 0 = A$. When two inputs exist, an exclusive OR operation is performed, and the results are fed to the next exclusive OR gate contained in the feedback network. These are several possible outputs. The output from the null filter indicates that the feedback taps have been found. The feedback taps can be found by noting the output of flip-flop 61 which typically takes the form of indicators such as lights 63 on the output of each of the flip-flops 61.

What is claimed is:

1. An apparatus for determining the feedback tap position of a transmitting binary code shift register generator, comprising:

a. an internal shift register generator, each stage thereof having a controllable feedback tap to the first tap thereof;

b. a bit position counter;

c. means for comparing the codes from the transmitting shift register generator and the internal shift register;

d. register means for producing an output pulse upon the occurrence of the transmitting code having identical binary digits in all stages, said output pulse being the reset pulse for the bit position counter and the internal shift register generator and the enabling pulse for the comparing means; and e. means for activating selected feedback taps of the internal shift register generator, the activating means being fed by the bit position counter and the comparing means.

2. Apparatus for locating feedback tap positions according to claim 1 wherein the register means for determining identical digits comprise:

a. a series of identity flip-flop stages, the transmitting code being fed to the first stage of the series;

b. an identity AND gate fed by each of the series of flip-flop stages; and c. a start flip-flop fed by the AND gate.

3. Apparatus for locating feedback tap positions according to claim 2 wherein the comparing means comprise:

a. an enabling AND gate fed by output of the first stage of the identity flip-flops and the output of the start flip-flop; and b. an exclusive OR gate fed by the enabling AND gate and the internal shift register generator.

4. Apparatus for locating feedback tap positions according to claim 3 wherein the internal shift register generator comprises:

a. a series of $n$ shift register flip-flop stages;

b. a series of $n$-1 tap switches fed by the outputs of the series of shift register flip-flops from the first to the $n1^{th}$ stage;

c. a shift register AND gate fed by the activating means and the output of the $n$'th stage of the series shift register flip-flops;

d. a first tap exclusive OR gate fed by the first two of the series of tap switches;

e. a series of subsequent tap exclusive OR gates each of which being fed by one of the series of tap switches and the preceding tap exclusive OR gate, and f. a final exclusive OR gate fed by the shift register AND gate and the $n1^{th}$ tap exclusive OR gate.

* * * * *